US008618000B2

United States Patent
Raghu et al.

(10) Patent No.: US 8,618,000 B2
(45) Date of Patent: *Dec. 31, 2013

(54) SELECTIVE WET ETCHING OF HAFNIUM ALUMINUM OXIDE FILMS

(75) Inventors: Prashant Raghu, Boise, ID (US); Yi Yang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/585,072

(22) Filed: Aug. 14, 2012

(65) Prior Publication Data

US 2012/0306059 A1  Dec. 6, 2012

Related U.S. Application Data

(63) Continuation of application No. 11/839,628, filed on Aug. 16, 2007, now Pat. No. 8,283,258.

(51) Int. Cl.
*H01L 21/302* (2006.01)

(52) U.S. Cl.
USPC ........... 438/745; 438/750; 438/754; 438/756; 216/83; 216/102; 216/103; 252/79.2

(58) Field of Classification Search
USPC ........... 438/745, 750, 754, 756; 216/83, 102, 216/103; 252/79.2
See application file for complete search history.

(56) References Cited

U.S. PATENT DOCUMENTS

| 4,877,647 | A | 10/1989 | Klabunde |
| 5,482,656 | A | 1/1996 | Hiroaka et al. |
| 5,538,655 | A | 7/1996 | Fauteux et al. |
| 5,622,668 | A | 4/1997 | Thomas et al. |
| 5,948,470 | A | 9/1999 | Harrison et al. |
| 6,103,632 | A | 8/2000 | Kumar et al. |
| 6,111,323 | A | 8/2000 | Carter et al. |
| 6,143,647 | A | 11/2000 | Pan et al. |
| 6,156,149 | A | 12/2000 | Cheung et al. |
| 6,200,909 | B1 | 3/2001 | Torek et al. |
| 6,403,382 | B1 | 6/2002 | Zhu et al. |
| 6,423,465 | B1 | 7/2002 | Hawker et al. |
| 6,503,841 | B1 | 1/2003 | Criscuolo et al. |
| 6,548,830 | B1 | 4/2003 | Noguchi et al. |
| 6,565,763 | B1 | 5/2003 | Asakawa et al. |
| 6,566,248 | B1 | 5/2003 | Wang et al. |
| 6,569,528 | B2 | 5/2003 | Nam et al. |
| 6,569,774 | B1 | 5/2003 | Trapp |

(Continued)

FOREIGN PATENT DOCUMENTS

| CN | 1562730 A | 1/2005 |
| EP | 0784543 A2 | 4/2000 |

(Continued)

OTHER PUBLICATIONS

Mindel et al., A Study of Bredig Platinum Sols, The Chemical Laboratories of New York University, vol. 65, p. 2112 (1943).

(Continued)

*Primary Examiner* — Binh X Tran
(74) *Attorney, Agent, or Firm* — TraskBritt

(57) ABSTRACT

Methods and etchant compositions for wet etching to selectively remove a hafnium aluminum oxide ($HfAlO_x$) material relative to silicon oxide ($SiO_x$) are provided.

19 Claims, 2 Drawing Sheets

(56) References Cited

U.S. PATENT DOCUMENTS

| | | |
|---|---|---|
| 6,689,473 B2 | 2/2004 | Guire et al. |
| 6,727,173 B2 * | 4/2004 | Sandhu et al. ............. 438/636 |
| 6,746,825 B2 | 6/2004 | Nealey et al. |
| 6,781,166 B2 | 8/2004 | Lieber et al. |
| 6,890,624 B1 | 5/2005 | Kambe et al. |
| 6,890,703 B2 | 5/2005 | Hawker et al. |
| 6,924,341 B2 | 8/2005 | Mays et al. |
| 6,926,953 B2 | 8/2005 | Nealey et al. |
| 6,949,456 B2 | 9/2005 | Kumar |
| 6,989,426 B2 | 1/2006 | Hu |
| 6,992,115 B2 | 1/2006 | Hawker et al. |
| 7,030,495 B2 | 4/2006 | Colburn et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,115,995 B2 | 10/2006 | Wong |
| 7,118,784 B1 | 10/2006 | Xie |
| 7,132,370 B2 | 11/2006 | Paraschiv et al. |
| 7,135,421 B2 | 11/2006 | Ahn et al. |
| 7,135,523 B2 | 11/2006 | Ho et al. |
| 7,163,712 B2 | 1/2007 | Chilkoti et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,202,308 B2 | 4/2007 | Boussand et al. |
| 7,211,492 B2 | 5/2007 | Forbes et al. |
| 7,291,284 B2 | 11/2007 | Mirkin et al. |
| 8,283,258 B2 * | 10/2012 | Raghu et al. ............. 438/745 |
| 2003/0091752 A1 | 5/2003 | Nealey et al. |
| 2003/0100822 A1 | 5/2003 | Lew et al. |
| 2003/0178707 A1 | 9/2003 | Abbott |
| 2003/0185741 A1 | 10/2003 | Matyjaszewski |
| 2003/0235985 A1 | 12/2003 | Christenson et al. |
| 2004/0124092 A1 | 7/2004 | Black |
| 2004/0127001 A1 | 7/2004 | Colburn et al. |
| 2004/0142578 A1 | 7/2004 | Wiesner et al. |
| 2004/0209194 A1 | 10/2004 | Kume et al. |
| 2004/0222415 A1 | 11/2004 | Chou et al. |
| 2004/0254317 A1 | 12/2004 | Hu |
| 2004/0256615 A1 | 12/2004 | Sirringhaus et al. |
| 2004/0265548 A1 | 12/2004 | Ho et al. |
| 2005/0019498 A1 * | 1/2005 | Osawa ............. 427/331 |
| 2005/0062165 A1 | 3/2005 | Saenger et al. |
| 2005/0067704 A1 | 3/2005 | Kaneko et al. |
| 2005/0074706 A1 | 4/2005 | Bristol et al. |
| 2005/0100830 A1 | 5/2005 | Xu et al. |
| 2005/0124135 A1 | 6/2005 | Ayazi et al. |
| 2005/0145959 A1 | 7/2005 | Forbes et al. |
| 2005/0208752 A1 | 9/2005 | Colburn et al. |
| 2005/0227473 A1 | 10/2005 | Iiara et al. |
| 2005/0238889 A1 | 10/2005 | Iwamoto et al. |
| 2005/0250053 A1 | 11/2005 | Marsh et al. |
| 2005/0272341 A1 | 12/2005 | Colburn et al. |
| 2006/0014001 A1 | 1/2006 | Zhang et al. |
| 2006/0046079 A1 | 3/2006 | Lee et al. |
| 2006/0062867 A1 | 3/2006 | Choi et al. |
| 2006/0078681 A1 | 4/2006 | Hieda et al. |
| 2006/7030495 | 4/2006 | Colburn |
| 2006/0094199 A1 | 5/2006 | Kil et al. |
| 2006/0105562 A1 | 5/2006 | Yi |
| 2006/0124467 A1 | 6/2006 | Ho et al. |
| 2006/0134556 A1 | 6/2006 | Nealey et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0216888 A1 | 9/2006 | Zheng et al. |
| 2006/0217285 A1 | 9/2006 | Destarac |
| 2006/0249784 A1 | 11/2006 | Black et al. |
| 2006/0258159 A1 | 11/2006 | Colburn et al. |
| 2006/0276048 A1 | 12/2006 | Raghu |
| 2006/0278158 A1 | 12/2006 | Tolbert et al. |
| 2006/0281266 A1 | 12/2006 | Wells |
| 2007/0007602 A1 | 1/2007 | Oda et al. |
| 2007/0020749 A1 | 1/2007 | Nealey et al. |
| 2007/0023805 A1 | 2/2007 | Wells et al. |
| 2007/7172953 | 2/2007 | Lieber |
| 2007/0045562 A1 | 3/2007 | Parekh |
| 2007/0048674 A1 | 3/2007 | Wells |
| 2007/0048941 A1 | 3/2007 | Tang et al. |
| 2007/0048976 A1 | 3/2007 | Raghu |
| 2007/0049045 A1 | 3/2007 | Zimmerman et al. |
| 2007/0059929 A1 | 3/2007 | Cho et al. |
| 2007/0071881 A1 | 3/2007 | Chua et al. |
| 2007/0072403 A1 | 3/2007 | Sakata |
| 2007/0099422 A1 * | 5/2007 | Wijekoon et al. ............. 438/687 |
| 2007/0122932 A1 | 5/2007 | Kodas et al. |
| 2007/0132004 A1 | 6/2007 | Yasuda et al. |
| 2007/0145009 A1 | 6/2007 | Fucsko et al. |
| 2007/0175859 A1 | 8/2007 | Black et al. |
| 2007/0181870 A1 | 8/2007 | Libertino et al. |
| 2007/0200477 A1 | 8/2007 | Tuominen et al. |
| 2007/0208159 A1 | 9/2007 | McCloskey et al. |
| 2007/0224819 A1 | 9/2007 | Sandhu |
| 2007/0227383 A1 | 10/2007 | Decre et al. |
| 2007/0249117 A1 | 10/2007 | Kang et al. |
| 2008/0064220 A1 | 3/2008 | Fernandez et al. |
| 2008/0103256 A1 | 5/2008 | Kim et al. |
| 2008/0164558 A1 | 7/2008 | Yang et al. |

FOREIGN PATENT DOCUMENTS

| | | |
|---|---|---|
| EP | 1416303 A2 | 5/2004 |
| JP | 11080414 A | 3/1999 |
| JP | 2005008882 A | 1/2005 |
| JP | 2006036923 A | 2/2006 |
| JP | 2006055982 A | 3/2006 |
| TW | 256110 | 6/2006 |
| WO | 9007575 | 7/1990 |
| WO | 9706013 | 2/1997 |
| WO | 9947570 | 9/1999 |
| WO | 02081372 | 10/2002 |
| WO | 2005/122285 | 12/2005 |
| WO | 2006/076016 | 7/2006 |
| WO | 2006/078952 | 7/2006 |
| WO | 2007/019439 | 2/2007 |
| WO | 2007/024241 | 3/2007 |
| WO | 2007/024323 | 3/2007 |
| WO | 2007/055041 | 5/2007 |
| WO | 2008/091741 | 7/2008 |
| WO | 2008/097736 | 8/2008 |
| WO | 2008/124219 | 10/2008 |

OTHER PUBLICATIONS

Naito et al., 2.5-Inch Disk Patterned Media Prepared by an Artificially Assisted Self-Assembling Method, IEEE Transactions on Magnetics, vol. 38, No. 5, Sep. 2002, pp. 1949-1951.

Nealey et al., Self-Assembling Resists for Nanolithography, IEEE 2005, 2 pages.

Nguyen et al., Photopolymerizable Hydrogels for Tissue Engineering Applications, Biomaterials 23, 2002, pp. 4307-4314.

Nguyen et al., Optical Band Gaps and composition Dependence of Hafnium-Aluminate Thin Films Grown by Atomic Layer Chemical Vapor Deposition. J. Vac. Sci. Technol. A 23(6) Nov./Dec. 2006.

Niu et al., Stability of Order in Solvent-Annealed Block Copolymer Thin Films, Macromolecules, 36(7), 2428-2440, 2003 (web release date: Mar. 13, 2003) http:// digitalcommons.uni.edu/cgi/viewcontent.cgi?article+1005&contect=chemeng_nanotechnology).

Parejo et al., Highly Efficient UV-Absorbing Thin-Film Coatings for Protection of Organic Materials Against Photodegradation, J. Mater. Chem., 2006, 16, pp. 2165-2169.

Park et al., Block Copolymer Lithography: Periodic Arrays of 1011 Holes in 1 Square Centimeter, Science, vol. 276, No. 5317, p. 1401-1404, May 30, 1997.

Park et al., Controlled Ordering of Block Copolymer Thin Films by the Addition of Hydrophilic Nanoparticles, Macromolecules, 2007, vol. 40, No. 22, pp. 8119-8124.

(56) References Cited

OTHER PUBLICATIONS

Park et al., Directed Assembly of Lamellae-Forming Block Copolymers by Using Chemically and Topographically Patterned Substrates, Adv. Mater., 2007, vol. 19, pp. 607-611.
Park et al., Enabling Nanotechnology with Self Assembled Block Copolymer Patterns, Polymer vol. 4, pp. 6725-6760 (2003).
Peters et al., Combining Advanced Lithographic Techniques and Self-assembly of Thin Films of Diblock Copolymers to Produce Templates for Nanofabrication, J. Vac. Sci. Technol. B, vol. 18, No. 6, Nov./Dec. 2000, pp. 3530-3532.
Peters et al., Morphology of Thin Films of Diblock Copolymers on Surfaces Micropatterned with Regions of Different Interfacial Energy, Macromolecules, vol. 35, No. 5, 2002, pp. 1822-1834.
Potemkin et al., Effect of the Molecular Weight of AB Diblock Copolymers on the Lamellar Orientation in Thin Films: Theory and Experiment, Macromol. Rapid Commun., 2007, 28, pp. 579-584.
Resnick et al., Initial Study of the Fabrication of Step and Flash Imprint Lithography Templates for the Printing of Contact Holes, J. Microlith., Microfab., Microsyst., vol. 3, No. 2, Apr. 2004, pp. 316-321.
Ruiz et al., Induced Orientational Order in Symmetric Diblock Copolymer Thin Films, Adv. Mater, 2007, 19, pp. 587-591.
Ryu et al., Surface Modification with Cross-Linked Random Copolymers: Minimum Effective Thickness, Macromolecules, vol. 40, No. 12, 2007, pp. 4296-4300.
Saraf et al., Spontaneous Planarization of Nanoscale Phase Separated Thin Film, Applied Physics Letters, vol. 80, No. 23, Jun. 10, 2002, pp. 4425-4427.
Shahrjerdi et al., Fabrication of Ni Nanocrystal Flash Memories Using a PoSHARMA et al. Ultrathin Poly (ethylene glycol) Films for Silicon-Based Microdevices, Applied Surface Science, 206 (2003), pp. 218-229.
Sharma et al. Ultrathin Poly(ethylene glycol) Films for Silicon-Based Microdevices, Applied Surface Science, 206 (2003), pp. 218-229.
Sigma-Aldrich, Tutorial regarding Materials for Lithography/ Nanopatterning, http://www.sigmaaldrich.com/ Area_of_Interest/ Chemistry/Materials_Science/Micro_and_Nanoelectronic website, retrieved Aug. 27, 2007, 8 pages.
Sivaniah et al., Observation of Perpendicular Orientation in Symmetric Diblock Copolymer Thin Films on Rough Substrates, Macromolecules 2003, 36, pp. 5894-5896.
Sivaniah, et al., Symmetric Diblock Copolymer Thin Films on Rough Substrates. Kinetics and Structure Formation in Pure Block Copolymer Thin Films, Macromolecules 2005, vol. 38, 1837-1849.
Solak, Nanolithography with Coherent Extreme Ultraviolet Light, Journal of Physics D: Applied Physics, vol. 39, 2006, pp. R171-R188.
Stoykovich et al., Directed Assembly of Block Copolymer Blends into Nonregular Device-Oriented Structures, Science, vol. 308, Jun. 3, 2005, pp. 1442-1446.
Stoykovich et al., Directed Self-Assembly of Block Copolymers for Nanolithography: Fabrication of Isolated Features and Essential Integrated Circuit Geometries, ACS Nano, vol. 1, No. 3, 2007, pp. 168-175.
Sundrani et al., Guiding Polymers to Perfection: Macroscopic Alignment of Nanoscale Domains, Nano Lett., vol. 4, No. 2, 2004, pp. 273-276.
Sundrani et al., Hierarchical Assembly and Compliance of Aligned Nanoscale Polymer Cylinders in Confinement, Langmuir 2004, vol. 20, No. 12, 2004, pp. 5091-5099.
Van Poll et al., A Self-Assembly Approach to Chemical Micropatterning of Poly(dimethylsiloxane), Angew. Chem. Int. Ed. 2007, vol. 46, pp. 6634-6637.
Winesett et al., Tuning Substrate Surface Energies for Blends of Polystyrene and Poly(methyl methacrylate), Langmuir 2003, vol. 19, pp. 8526-8535.
Wu et al., Self-Assembled Two-Dimensional Block Copolymers on Pre-Patterned Templates with Laser Interference Lithography, IEEE, 2007, pp. 153-154.
Xu et al., The Influence of Molecular Weight on Nanoporous Plymer Films, Polymer vol. 42, (2001) pp. 9091-9095.
Yamaguchi et al., Resist-Pattern Guided Self-Assembly of Symmetric Diblock Copolymer, Journal of Photopolymer Science and Technology, vol. 19, No. 3, 2006, pp. 385-388.
Yan et al., Preparation and Phase Segregation of Block Copolymer Nanotube Multiblocks, J. Am. Chem. Soc., vol. 126, No. 32, 2004, pp. 10059-10066.
Yang et al., Guided Self-Assembly of Symmetric Diblock Copolymer Films on Chemically Nanopatterned Substrates, Macromolecules 2000, vol. 33, No. 26, 2000, pp. 9575-9582.
Yurt et al., Scission of Diblock Copolymers into Their Constituent Blocks, Macromolecules 2006, vol. 39, No. 5, 2006, pp. 1670-1672.
Zhang et al., Highly Ordered Nanoporous Thin Films from Cleavable Polystyrene-Block-Poly(ethylene oxide), Adv. Mater. 2007, 19, pp. 1571-1576.
Bae, Surface Modification Using Photo-Crosslinkable Random Copolymers, Abstract submitted for the Mar. 2006 meeting of The American Physical Society, submitted Nov. 30, 2005, 1 page.
Bang, The Effect of Humidity on the Ordering of Tri-block Copolymer Thin Films, Abstract submitted for the Mar. 2007 meeting of The American Physical Society, submitted Nov. 20, 2006, 1 page.
Bass et al, Microcontact Printing with Octadecanethiol, Applied Surface Science, 226(4), pp. 335-340, Apr. 2004, http://www.ece.virginia.edu/UVML/sis/Papers/rbbpapers/assoct.pdf.
Bearinger et al., Chemisorbed Poly(propylene sulphide)-based Copolymer Resist Biomolecular Interactions, Nature Materials vol. 2, 259-264, 2003.
Black et al., Polymer Self Assembly in Semiconductor Microelectronics, IBM J. Res. & Dev., vol. 51, No. 5, Sep. 2007, pp. 605-633.
Black, Integration of Self Assembly for Semiconductor Microelectronics, IEEE 2005 Custom Integrated Circuits Conference, pp. 87-91 (2005).
Black, Polymer Self-Assembly as a Novel Extension to Optical Lithography, ACSNano, vol. 1, No. 3, 2007, American Chemical Society, pp. 147-150.
Black et al., High-Capacity, Self-Assembled Metal-Oxide-Semiconductor Decoupling Capacitors, IEEE Electron on Device Letters, vol. 25, No. 9, Sep. 2004, pp. 622-624.
Brydson et al. (chapter authors), Generic Methodologies for Nanotechnology: Classification and Fabrication, Nanoscale Science and Technology, edited by R.W. Kelsall, et al., 2005 John Wiley & Sons, Ltd., (published online: Dec. 20, 2005) (http://www3.interscience.wiley.corn/cgi-bin/summary/112217550/SUMMARY).
Canaria et al., Formation and Removal of Alkylthiolate Self-Assembled Monolayers on Gold in Aqueous Solutions, Lab Chip 6, 289-295 (2006), http://www.rsc.org/publishing/journals/LC/article.asp?doi=b51066c) (Abstract).
Chandekar et al., Template-Directed Adsorption of block Copolymers on Alkanethiol-Patterned Gold Surfaces, (circa 2006), 1 page. http://www.nano.neu.eduindustry/industiy_showcase/industiy_day/documents/Chandekarpdf) (Powerpoint template for scientific posters (Swarthmore College)).
Cheng et al., Rapid Directed Self Assembly of Lamellar Microdomains from a Block Copolymer Containing Hybrid, Applied Physics Letters, 91, 143106-143106-3 (2007).
Cheng et al., Self-Assembled one-Dimensional Nanostructure Arrays, Nano Letters, vol. 0, No. 0, A-E, published on Web Aug. 16, 2006, 5 pages.
Cheng et al., Templated Self-Assembly of Block Copolymers: Effect of Substrate Topography, Adv. Mater. 2003, vol. 15, No. 19, pp. 1599-1602.
Christenson, Selective Wet Etching of High-K Materials, Solid State Technology Online, Jul. 3, 2003, pp. 1-7, XP002361400.
Daoulas et al., Fabrication of Complex Three-Dimensional Nanostructures from Self-Assembling Block Copolymer Materials on Two-Dimensional Chemically Patterned Templates with Mismatched Symmetry, Physical Review Letters 96, week ending Jan. 27, 2006, pp. 036104-1-036104-3.
Desai et al., Engineered Silicon Surfaces for Biomimetic Interfaces, Business Briefing: Medical Device Manufacturing & Technology, 2002, 4 pages.

(56) References Cited

OTHER PUBLICATIONS

Edwards et al., Mechanism and Kinetics of Ordering in Diblock Copolymer Thin Films on Chemically Nanopatterned Substrates, Journal of Polymer Science: Part B Polymer Physics, vol. 43, 3444-3459 (2005).
Edwards et al., Precise Control Over Molecular Dimensions of Block-Copolymer Domains Using the Interfacial Energy of Chemically Nanopatterned Substrates, Advanced Mater, 16, No. 15, Aug. 4, 2004, pp. 1315-1319.
Fasolka et al., Morphology of Ultrathin Supported Diblock Copolymer Films: Theory and Experiment, Macromolecules, vol. 33, No. 15, pp. 5702-5712 (2000).
Gates et al., Unconventional Nanofabrication, Annu. Rev. Mater. Res. vol. 34, pp. 339-372 (2004).
Ge et al., Thermal Conductance of Hydrophilic and Hydrophobic Interfaces, PRL 96, 186101-1-186101-4, The American Physical Society, week ending May 12, 2006.
Genua et al., Functional Patterns Obtained by Nanoimprinting Lithography and Subsequent Growth of Polymer Brushes, Nanotechnology, vol. 18, pp. 1-7 (2007).
Gillmor et al., Hydrophilic/Hydrophobic Patterned Surfaces as Templates for DNA Arrays, Langmuir 2000, vol. 16, No. 18, 2000, pp. 7223-7228.
Gotelho et al., Diblock Copolymer Ultrathin Films Studied by High Resolution Electron Energy Loss Spectroscopy, Surface Science, 482-485 (2001), pp. 1228-1234.
Gudipati et al., Hyperbranched Fluoropolymer and Linear Poly(ethylene glycol) Based Amphiphilic Crosslinked Networks as Efficient Antifouling Coatings: An Insight into the Surface Compositions, ;Topographies, and Morphologies, Journal of Polymer Science Part A: Polymer Chemistry, vol. 42, No. 24, pp. 6193-6208 (Oct. 27, 2004).
Guo et al., Synthesis and Characterization of Novel Biodegradable Unsaturated Poly(ester amide)/Poly(ethylene glycol) Diacrylate Hydrogels, Journal of Polymer Science Part A: Polymer Chemistry, vol. 43, No. 17. pp. 3932-3944 (Jul. 21, 2005).
Hamley, Introduction to Block Copolymers, Developments in Block Copolymers Science and Technology, 2004, John Wiley & Sons, Ltd., pp. 1-29.
Hermans et al., Application of Solvent-Directed Assembly of Block Copolymers to the Synthesis of Nanostructured Materials with Low Dielectric Constants, Angewandte Chem. Int. Ed. 2006, 45, pp. 6648-6652.
Hutchinson et al., Polymerizable Living Free Radical Initiators as a Platform to Synthesize Functional Networks, Chem. Mater., vol. 17, No. 19, 2005, pp. 4789-4797.
In et al., Side-Chain-Grafted Random Copolymer Brushes as Neutral Surfaces for Controlling the Orientation of Block Copolymer Microdomains in Thin Films, Langmuir, vol. 22, No. 18, 2006, pp. 7855-7860.
Kim et al., Epitaxial Self-Assembly of Block Copolymers on Lithographically Defined Nanopatterned substrates, Nature, vol. 424, Jul. 24, 2003, pp. 411-414.
Kim et al., Novel Complex Nanostructure from Directed Assembly of Block Copolymers on Incommensurate Surface Patterns, Adv. Mater., 2007, 19, pp. 3271-3275.
Kim et al., Salt Complexation in Block Copolymer Thin Films, Macromolecules 2006, vol. 39, No. 24, 2006, pp. 8473-8479.
Kim et al., Solvent-Induced Ordering in Thin Film Diblock Copolymer/Homopolymer Mixtures, Advanced Mater., vol. 16, No. 23-24, pp. 2119-2123, Dec. 17, 2004.
Krishnamoorthy et al., Nanoscale Patterning with Block Copolymers, MaterialsToday, vol. 9, No. 9, Sep. 2006, pp. 40-47.
La et al., Directed Assembly of Cylinder-Forming Block Copolymers into Patterned Structures to Fabricate Arrays of Spherical Domains and Nanoparticles, Chem. Mater., 2007, vol. 19, No. 18, pp. 4538-4544.
Laracuente et al., Step Structure and Surface Morphology of Hydrogen-Terminated Silicon: (001) to (114), Surface Science 545, 2003, pp. 70-84.
Lentz et al., Whole Wafer Imprint Patterning Using Step and Flash Imprint Lithography: A Manufacturing Solution for Sub 100 nm Patterning, SPIE Advanced Lithography Paper, http:llmolecularimprints.comlNewsEventsltech_artioles/new_articles/SPIE_07_MII_WW_Paper.pdf), Feb. 2007, pp. 1-10.
Li et al., Block Copolymer Patterns and Templates, MaterialsToday, vol. 9, No. 9, Sep. 2006, pp. 30-39.
Li et al., Morphology Change of Asymmetric Diblock Copolymer Micellar Films During Solvent Annealing, ScienceDirect, Polymer 48 (2007), pp. 2434-2443.
Lin et al., A Rapid Route to Arrays of Nanostructures in Thin Films, Adv. Mater. 2002, 14 No. 19, Oct. 2, pp. 1373-1376.
Lin-Gibson et al., Structure-Property Relationships of Photopolymerizable Poly(ethylene glycol) Dimethacrylate Hydrogels, Macromolecules 2005, 38, pp. 2897-2902.
Malkoch et al., Synthesis of Well-Defined hydrogel Networks Using Chemistry, Chem. Commun., 2006, pp. 2774-2776.
Mansky et al., Controlling Polymer-Surface Interactions with Random Copolymer Brushes, Science, vol. 275, Mar. 7, 1997, pp. 1458-1460.
Maye et al., Chemical Analysis Using Scanning Force Microscopy, Journal of Chemical Education, vol. 79, No. 2, Feb. 2002, pp. 207-210.
Messenga et al., On the Role of Block Copolymers in Self-Assembly of Dense Colloidal Polymeric Systems, Langmuir 2003, vol. 19, No. 20, 2003, pp. 8144-8147.
Metters et al., Network Formation and Degradation Behavior of Hydrogels Formed by Michael-Type Addition Reactions, Biomacromolecules 2005, 6, pp. 290-301, 2005.
Meyer et al., Controlled Dewetting Processes on Microstructured Surfaces—A New Procedure for Thin Film Microstructuring, Macromollecular Mater. Eng., 2761277, 2000, pp. 44-50.

* cited by examiner

SELECTIVE WET ETCHING OF HAFNIUM ALUMINUM OXIDE FILMS

CROSS-REFERENCE TO RELATED APPLICATION

This application is a continuation of U.S. patent application Ser. No. 11/839,628, filed Aug. 16, 2007, now U.S. Pat. No. 8,283,258, issued Oct. 9, 2012, the disclosure of which is hereby incorporated herein by this reference in its entirety.

TECHNICAL FIELD

Embodiments of the invention relate to etchant chemistries and methods of processing a substrate and semiconductor constructions.

BACKGROUND OF THE INVENTION

Conventionally, in a manufacturing process for a semiconductor device, openings such as contact holes are formed in dielectric layers by plasma etching using a patterned photoresist layer as a mask. However, as device sizes decrease, the size of features such as contact holes is reduced, requiring the replacement of conventionally used resist masks.

A hard mask formed of amorphous or transparent carbon has been used for dry etching of silicon oxide films, which offers high etch selectivity relative to a photoresist or other hard mask materials. However, the use of amorphous carbon as a mask is inapplicable for some processes when plasma etching silicon oxide, in part, because a sufficient selectivity of the silicon oxide film against the amorphous carbon mask cannot be obtained. In addition, etching features in silicon oxide that are 25 nm or less often requires the use of a very thick carbon film, which is generally not extendable for 25 nm patterning due to toppling of the mask structures, making a conventional amorphous carbon mask unsuitable.

It would be useful to provide processes that overcome these or related problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE INVENTION

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

Embodiments of the invention relate to the use of hafnium aluminum oxide ($HfAlO_x$) as a hard mask in etching silicon oxide, and solutions that provide etchant chemistry for selective removal of $HfAlO_x$ material from a structure relative to exposed doped and undoped silicon oxide materials including, but not limited to, silicon oxide deposited from tetraethylorthosilicate (TEOS), spin-on-glass (SOG), undoped $SiO_2$, phosphosilicate glass (PSG), borophosphosilicate glass (BPSG), and borosilicate glass (BSG). By "selectively" etching or removal of the $HfAlO_x$ material, it is meant that the etch is preferential to the $HfAlO_x$ material relative to adjacent or exposed silicon oxide with little or no etching of the silicon oxide, and that the $HfAlO_x$ material is etched at a rate greater than the silicon oxide. The compositions of the invention have increased selectivity to $HfAlO_x$ material in the presence of silicon oxide materials compared to conventional wet chemistries commonly used for removing $HfAlO_x$ material. The etchant solution can be used in applications for fabricating contact openings, word lines, digit lines, among other features and structures.

Figure 1:
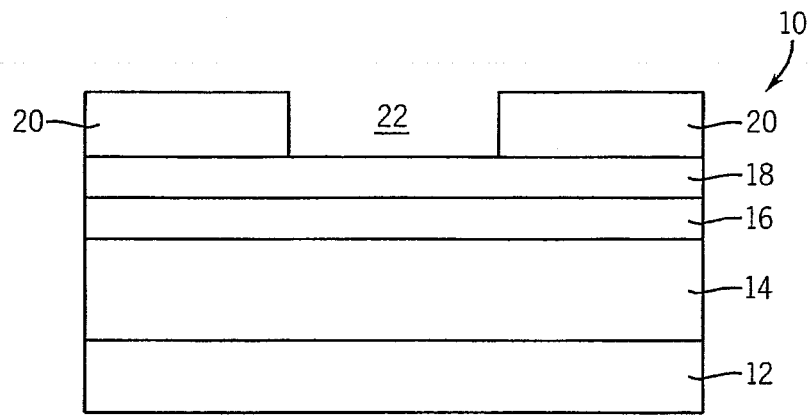
FIG. 1 illustrates a diagrammatic, cross-sectional view of a portion of a substrate at a preliminary processing stage according to an embodiment of the present disclosure.

An embodiment of a method according to the invention is illustrated with reference to FIGS. 1-6. FIG. 1 illustrates a substrate fragment indicated generally with reference to numeral 10 at a preliminary processing stage. The substrate fragment 10 in progress can comprise a semiconductor wafer substrate or the wafer along with various process layers formed thereon, including one or more semiconductor layers or other formations, and active or operable portions of semiconductor devices.

The substrate fragment 10 comprises a substrate 12, a dielectric (silicon oxide) layer 14 to be etched, a hafnium aluminum oxide ($HfAlO_x$) layer 16, a dielectric antireflective coating (DARC) layer 18, and a photoresist masking layer 20.

The substrate 12 is compositionally dissimilar to the silicon oxide layer 14, and can be composed of a silicon layer such as monocrystalline, polycrystalline or amorphous silicon, a doped silicon region, a nitride material (e.g., silicon nitride such as $Si_3N_4$, a refractory metal nitride such as titanium nitride (TiN), tungsten nitride (WN), etc.), a silicon oxide layer with different doping than a silicon oxide dielectric layer 14, a metal silicide such as titanium silicide ($TiSi_2$), a metal interconnect, or other material layer.

The dielectric layer 14 can be formed of undoped or doped silicon oxide ($SiO_x$), for example, silicon oxide deposited from tetraethylorthosilicate (TEOS), borophosphosilicate glass (BPSG), borosilicate glass (BSG), phosphosilicate glass (PSG), spin-on-glass (SOG), etc., in a single layer or multiple layers. In various embodiments, the dielectric ($SiO_x$) layer 14 will comprise, consist essentially of or consist of silicon and oxygen. A typical thickness of the dielectric layer 14 is about 1,000-20,000 Å.

A hafnium aluminum oxide layer 16 ($Hf_xAl_yO_z$ or $HfAlO_x$ such as $HfAlO_3$), a high dielectric constant (high-k) material, replaces a conventional hard mask such as a carbon-based hard mask that is generally formed over a material to be etched. In embodiments of the invention, the $HfAlO_x$ layer 16 is formed as a hard mask over the dielectric ($SiO_x$) layer 14 by atomic layer deposition (ALD) processing with a concentration ratio of Hf:Al in the film at about 20:1 to about 4:1 (wt-%), or about 10:1 to about 8:1 (ALD deposition temperature of about 300° C.). The thickness of the HfAlO$_x$ hard mask layer 16 is generally about 200-1,000 Å, or about 300-500 Å.

The HfAlO$_x$ hard mask layer 16 can be formed by ALD processing using known techniques in the art, for example, as described in U.S. Pat. No. 7,211,492 (Forbes et al.) and U.S. Pat. No. 7,135,421 (Ahn et al.), which are commonly assigned to Micron Technology, Inc., the disclosures of which are incorporated by reference herein. Briefly, the HfAlO$_x$ hard mask layer 16 can be formed using ALD processing by employing a hafnium sequence of pulsing a hafnium-containing precursor (e.g., HfCl$_4$) into a reaction chamber containing a substrate and pulsing a first oxygen-containing precursor (e.g., water vapor) into the reaction chamber as an oxidizing reactant to form hafnium oxide, and an aluminum sequence by pulsing an aluminum-containing precursor (e.g., trimethylaluminum, Al(CH$_3$)$_3$, or DMEAA, an adduct of alane (AlH$_3$) and dimethylethylamine (N(CH$_3$)$_2$(C$_2$H$_5$)), into the reaction chamber and pulsing a second oxygen containing precursor (e.g., distilled water vapor) into the reaction chamber as an oxidizing reactant to form a HfAlO$_x$ film. Each precursor is pulsed into the reaction chamber for a selected time period (pulse time), typically from about 0.5 seconds to about 2-3 seconds. Between each precursor pulsing, the reaction chamber is purged with an inert gas (e.g., nitrogen or argon) or evacuated to remove precursor excess and reaction by-products. The thickness of the HfAlO$_x$ film is controlled by repeating for a number of cycles the pulsing of the Hf-containing precursor, the first O-containing precursor, the Al-containing precursor, and the second O-containing precursor until the desired thickness is formed. In addition, the HfAlO$_x$ hard mask layer 16 can be engineered with selected characteristics by controlling precursor materials for each sequence, processing temperatures and pressures for each sequence, individual precursor pulsing times, and heat treatment at the end of the process, at the end of each cycle, and at the end of each sequence.

A dielectric antireflective coating layer (DARC) 18 overlies the HfAlO$_x$ hard mask layer 16 and is generally a silicon oxynitride (Si$_x$O$_y$N$_z$, e.g., where x=10-60, y=20-50, z=10-20, for example, Si$_{50}$O$_{37}$N$_{13}$). The DARC layer 18 can serve as an intermediate hard mask to reduce light reflections during lithography. The DARC layer 18 can be deposited onto the HfAlO$_x$ hard mask layer 16 by known processes, such as chemical vapor deposition (CVD) or plasma enhanced CVD (PECVD) including, for example, electron cyclotron resonance (ECR) PECVD, and bias ECR PECVD processes, for example, using a feed gas that comprises SiH$_4$, N$_2$, O$_2$, and argon. A typical thickness of the DARC layer 18 is about 200-1,000 Å, or about 300-400 Å.

A photoresist mask layer 20, typically an organic polymeric material (e.g., a novolac resin), is formed over the DARC layer 18 and, as depicted, exposed and developed using conventional photolithographic techniques as known in the art, to provide a desired pattern with openings 22 that expose portions of the DARC layer 18.

Figure 2:
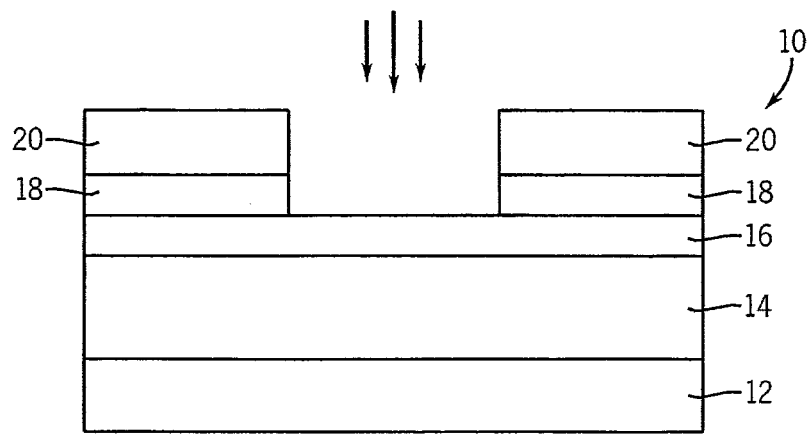
FIGS. 2-6 are cross-sectional views of the substrate depicted in FIG. 1 at subsequent processing stages.

The pattern in the photoresist mask layer 20 can be transferred to the DARC layer 18 by a standard dry etch (arrows ↓↓↓) using, for example, a fluorine-based gas plasma chemistry to expose the underlying HfAlO$_x$ hard mask layer 16, as shown in FIG. 2.

Figure 3:
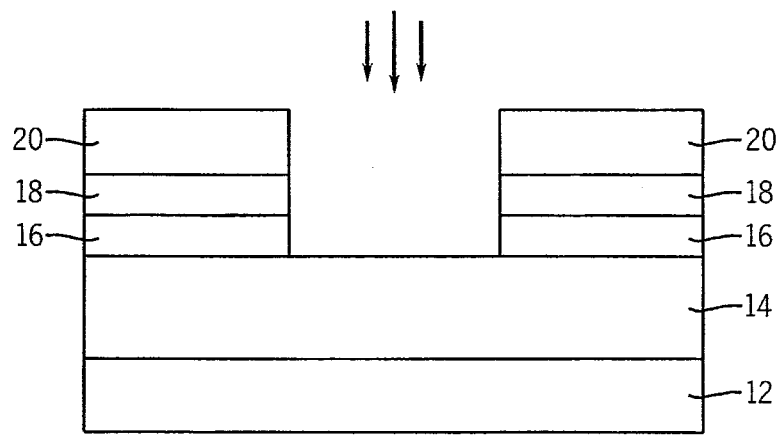

Then, as illustrated in FIG. 3, the HfAlO$_x$ hard mask layer 16 can be dry etched (arrows ↓↓↓) using a standard chemistry to expose portions of the silicon oxide layer 14. An etchant gas is used, for example, a mixture of boron trichloride (BCl$_3$) and chlorine (Cl$_2$) gases, which provides good selectivity to etch HfAlO$_x$ and stop on TEOS or other silicon oxide material (e.g., substrate 12).

Figure 4:
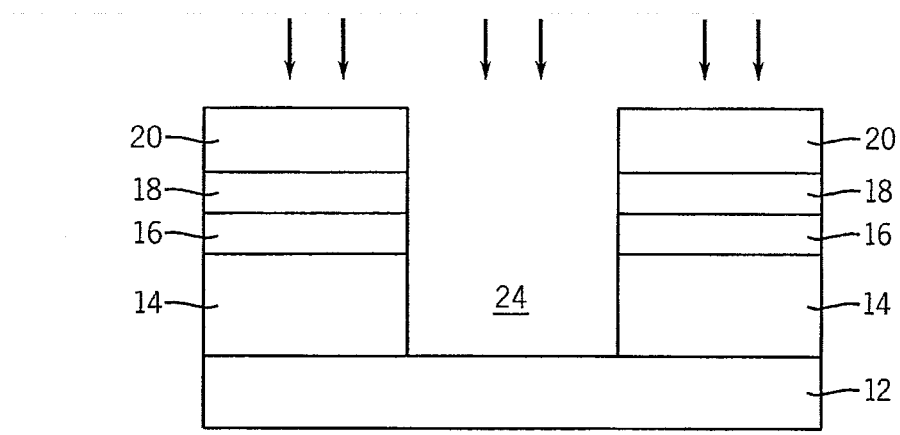

Referring now to FIG. 4, the dielectric (SiO$_x$) layer 14 is then dry etched to form a contact opening 24 (i.e., contact hole, via, or other opening such as a trench) extending to the underlying substrate layer 12 for forming, for example, a contact hole for an interconnect level, a gate electrode, a capacitor electrode, a via, etc. A silicon oxide dry etch can be conducted according to known methods using a standard fluorocarbon-based dry etch chemistry (e.g., CF$_4$, CHF$_3$, CH$_2$F$_2$, CH$_3$F, C$_2$F$_6$, C$_3$F$_8$, C$_4$F$_6$, etc.). Typically, the contact opening 24 is etched to a high aspect ratio of about 1:1 to about 20:1 with a width of about 15-65 nm and a depth of about 100 nm-2,000 nm, for example.

Figure 5:
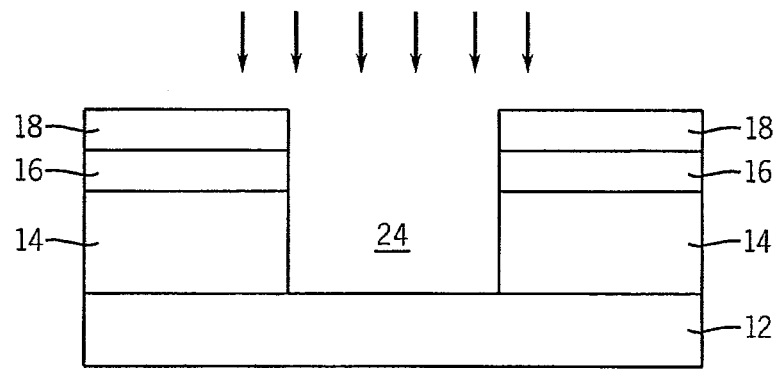

After the etch of the contact opening 24 is completed, the photoresist mask layer 20 is selectively removed (dry stripped) as shown in FIG. 5, for example, by a standard dry etch process using an oxygen (O$_2$) plasma ashing step.

Figure 6:
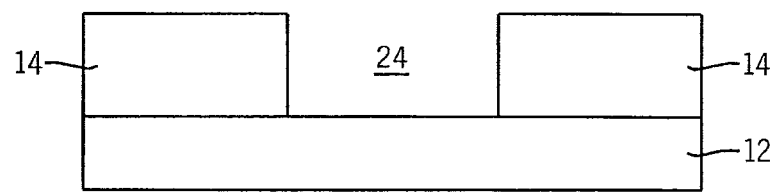

Then, in accordance with the invention, the DARC layer 18 and the HfAlO$_x$ hard mask layer 16 are removed (stripped) selective to the dielectric (SiO$_x$) layer 14 and the substrate 12, as illustrated in FIG. 6.

Conventional processes for removing HfAlO$_x$ (and DARC) materials typically use hydrofluoric acid (HF) based chemistries, e.g., a dilute HF/water wet etch. However, standard dilute HF etch chemistries are not selective to and will attack and rapidly etch silicon oxides such as BPSG, PSG and TEOS. This necessitates the use of different etch chemistries for stripping HfAlO$_x$ materials in the presence of oxides.

The etchant compositions of the invention are aqueous solutions of phosphoric acid (H$_3$PO$_4$) and water (H$_2$O) that etch HfAlO$_x$ material selective to silicon oxide (e.g., BPSG, PSG, TEOS, etc.). Embodiments of the etchant compositions are formulated with a H$_3$PO$_4$:H$_2$O volume ratio of about 50:50 to about 90:10, or about 80:20 to about 85:15, based on the total volume of the solution. A temperature range of about 100-185° C. is typical for most applications. The H$_3$PO$_4$:H$_2$O etchant compositions are maintained at a pH level <2, which can be manipulated by adding an additional acid such HCl, H$_2$SO$_4$, HNO$_3$, HCOOH and CH$_3$COOH, among others. In some embodiments, the etchant composition consists essentially of or consists of phosphoric acid and water, optionally with an additional acid in a minor but effective amount to modify the pH of the solution.

The H$_3$PO$_4$/H$_2$O etchant solution can be applied to the material layers, e.g., the HfAlO$_x$ layer 16 and DARC layer 18, to be stripped in various ways. For example, the etchant solution can be sprayed onto the substrate 10, or the substrate can be dipped or immersed into a bath of the etchant solution (e.g., a megasonic bath), or the etchant solution can be flowed over the substrate, among other applications.

The H$_3$PO$_4$/H$_2$O etchant compositions provide a wet etch of HfAlO$_x$ (about 10:1 Hf:Al ratio) and DARC materials selective to the SiO$_x$ material layer 14 at an etch rate (or selectivity) of greater than 1, or an etch selectivity of about 2:1 to about 20:1 (HfAlO$_x$:SiO$_x$), with little or no etching of the SiO$_x$ layer. Etchant compositions having a H$_3$PO$_4$:H$_2$O volume ratio of about 50:50 to about 90:10 (temperature of about 100-185° C.) provide an etch of ALD HfAlO$_x$ (Hf:Al ratio of about 20:1 to about 4:1) at a rate about 50-400 Å/minute, an etch of a DARC material layer 18 at a rate of about 5-40 Å/minute or about 20-40 Å/minute, and minimal etching of a SiO$_x$ material layer 14 at about 5-40 Å/minute or about 5-15 Å/minute. For example, the application of an etchant solution of H$_3$PO$_4$:H$_2$O at a ratio of about 80:20 to about 85:15 (v/v) (temperature of about 100-185° C.) will etch ALD HfAlOx (about 10:1 Hf:Al ratio) at an etch selectivity of about 8:1 to about 12:1. The application of an about 10:1 (v/v) H$_3$PO$_4$:H$_2$O etchant solution at about 145° C. will provide an etch of an ALD HfAlO$_x$ film 16 (about 10:1 Hf:Al ratio) at a rate of about 300 Å/minute.

Materials such as PSG, TiN, Si$_x$N$_y$, etc., can be exposed as the substrate layer 12 or at different levels in a material stack during the wet etch of the HfAlO$_x$ material layer 16. The H$_3$PO$_4$:H$_2$O etchant compositions have a selectivity (or etch rate) to PSG of about 10:1 (HfAlO$_x$:PSG), a selectivity to titanium nitride (TiN) of about 43:1 (HfAlO$_x$:TiN), and a selectivity to silicon nitride (Si$_x$N$_y$, e.g., such as Si$_3$N$_4$) of about 6:1 (HfAlO$_x$:Si$_x$N$_y$).

The etchant solution can be used in applications for fabricating contact openings as illustrated, or other features such as word lines, digit lines, etc. The substrate 10 can then undergo post-etch processing steps that are known in the art to fabricate desired components. For example, the resulting contact openings 24 can be further processed, for example, by filling with a metal or conductive material such as copper, aluminum, silicon, Ti$_3$N$_4$, among others, to form contacts or conductive lines, for example, to an underlying active area, contact, or conductive line, or with a metal-insulator-metal-stack to form capacitors with a dielectric material such as Al$_2$O$_3$, HfO$_2$, ZrO$_2$, SrTiO$_3$, and the like, in the fabrication of integrated circuit devices such as memory devices. Finished semiconductor wafers can be cut into dies, which may then be further processed into integrated circuit chips and incorporated in electronic devices.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of forming a semiconductor device, comprising:
   forming a plurality of openings extending through a dielectric antireflective coating material, a hafnium aluminum oxide material, and a silicon oxide material; and
   exposing the dielectric antireflective coating material, the hafnium aluminum oxide material, and the silicon oxide material to an etchant solution consisting essentially of water and phosphoric acid to remove the dielectric antireflective coating material and the hafnium aluminum oxide material overlying the silicon oxide material.

2. The method of claim 1, wherein forming a plurality of openings extending through a dielectric antireflective coating material, a hafnium aluminum oxide material, and a silicon oxide material comprises forming the plurality of openings having an aspect ratio of from about 1:1 to about 20:1.

3. The method of claim 1, further comprising filling the plurality of openings with a conductive material.

4. The method of claim 1, further comprising forming a metal-insulator-metal-stack in the plurality of openings.

5. The method of claim 1, wherein exposing the dielectric antireflective coating material, the hafnium aluminum oxide material, and the silicon oxide material to an etchant solution consisting essentially of water and phosphoric acid comprises exposing the dielectric antireflective coating material, the hafnium aluminum oxide material, and the silicon oxide material to the etchant solution at a temperature of from about 100° C. to 185° C.

6. The method of claim 1, wherein exposing the dielectric antireflective coating material, the hafnium aluminum oxide material, and the silicon oxide material to an etchant solution consisting essentially of water and phosphoric acid comprises exposing the dielectric antireflective coating material, the hafnium aluminum oxide material, and the silicon oxide material to the etchant solution having a pH of less than 2.

7. The method of claim 1, wherein exposing the dielectric antireflective coating material, the hafnium aluminum oxide material, and the silicon oxide material to an etchant solution consisting essentially of water and phosphoric acid comprises removing the hafnium aluminum oxide material at a rate of from about 50 Å/minute to 400 Å/minute, etching the dielectric antireflective coating material at a rate of from about 20 Å/minute to 40 Å/minute, and etching the silicon oxide material at a rate of from about 5 Å/minute to 15 Å/minute.

8. The method of claim 1, wherein exposing the dielectric antireflective coating material, the hafnium aluminum oxide material, and the silicon oxide material to an etchant solution consisting essentially of water and phosphoric acid comprises removing the dielectric antireflective coating material and hafnium aluminum oxide material at an etch selectivity of from about 2:1 to about 20:1 relative to the silicon oxide material.

9. A method of forming a semiconductor device, comprising:
   forming a dielectric antireflective coating material over a hafnium aluminum oxide material, the hafnium aluminum oxide material overlying a dielectric material on a substrate;
   forming at least one opening through the dielectric antireflective coating material, the hafnium aluminum oxide material and the dielectric material; and
   applying an etchant solution consisting of phosphoric acid, water and a pH modifying acid to remove the dielectric antireflective coating material and the hafnium aluminum oxide material at a faster rate than the dielectric material.

10. The method of claim 9, wherein the dielectric material is a silicon oxide material consisting essentially of silicon and oxygen.

11. The method of claim 9, wherein the dielectric material comprises a silicon oxide material selected from the group consisting of tetraethylorthosilicate, borophosphosilicate glass, borosilicate glass, phosphosilicate glass, spin-on-glass, undoped silicon oxide, and combinations thereof.

12. The method of claim 9, wherein the hafnium aluminum oxide material has a Hf:Al ratio of from about 20:1 to about 4:1.

13. The method of claim 9, wherein the dielectric antireflective coating material comprises a silicon oxynitride of chemical formula Si$_x$O$_y$N$_z$, wherein x is from 10 to 60, y is from 20 to 50, and z is from 10 to 20.

14. The method of claim 9, wherein forming at least one opening through the dielectric antireflective coating material, the hafnium aluminum oxide material and the dielectric material comprises forming at least one opening having a width of from about 15 nm to 65 nm and a depth of from about 100 nm to 2,000 nm.

15. The method of claim 9, wherein applying an etchant solution consisting of phosphoric acid, water and a pH modifying acid to remove the dielectric antireflective coating material and the hafnium aluminum oxide material at a faster rate than the dielectric material comprises removing the dielectric antireflective coating material and the hafnium aluminum oxide material without substantially removing the dielectric material.

16. The method of claim 9, wherein applying an etchant solution consisting of phosphoric acid, water and a pH modifying acid to remove the dielectric antireflective coating material and the hafnium aluminum oxide material comprises removing the dielectric antireflective coating material and the hafnium aluminum oxide material at a faster rate than the dielectric material and the substrate.

17. The method of claim 9, wherein the pH modifying acid is selected from the group consisting of HCl, $H_2SO_4$, $HNO_3$, HCOOH and $CH_3COOH$.

18. The method of claim 9, wherein applying an etchant solution consisting of phosphoric acid, water and a pH modifying acid comprises applying the etchant solution having a volume ratio of phosphoric acid to water of about 50:50 to about 90:10.

19. The method of claim 9, wherein applying an etchant solution consisting of phosphoric acid, water and a pH modifying acid comprises applying the etchant solution having a temperature of from about 100° C. to about 185° C.

* * * * *